(12) United States Patent
Clara et al.

(10) Patent No.: US 7,372,383 B2
(45) Date of Patent: May 13, 2008

(54) METHOD FOR CALIBRATING A DIGITAL/ANALOG CONVERTER AND DIGITAL/ANALOG CONVERTER

(75) Inventors: Martin Clara, Villach (AT); Antonio Di Giandomenico, Velden am Woerthersee (AT); Wolfgang Klatzer, Mittertrixen (AT); Luca Gori, Gorizia (IT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/403,470

(22) Filed: Apr. 13, 2006

(65) Prior Publication Data

US 2006/0232455 A1   Oct. 19, 2006

(30) Foreign Application Priority Data

Apr. 14, 2005   (DE)   ...................... 10 2005 017 304

(51) Int. Cl.
*H03M 3/00*   (2006.01)

(52) U.S. Cl. ..................................... 341/143; 455/234.1

(58) Field of Classification Search ................ 341/120, 341/118, 143; 342/368; 455/234.1
See application file for complete search history.

(56) References Cited

U.S. PATENT DOCUMENTS

| | | | | |
|---|---|---|---|---|
| 2001/0026233 | A1* | 10/2001 | Hellberg et al. | ............ 341/120 |
| 2002/0171569 | A1* | 11/2002 | Zhang et al. | ................ 341/120 |
| 2006/0164298 | A1* | 7/2006 | Azuma | ........................ 342/368 |

FOREIGN PATENT DOCUMENTS

DE   19916879   10/1999

* cited by examiner

*Primary Examiner*—Jean B. Jeanglaude
*Assistant Examiner*—Joseph Lauture
(74) *Attorney, Agent, or Firm*—Jenkins, Wilson, Taylor & Hunt, P.A.

(57) ABSTRACT

A digital/analog converter comprises a converter array comprised of a plurality of converter cells and a device for self-calibration of the converter cells. The device for self-calibration comprises at least one reference cell with a reference value and a control device for controlling a calibration process. The control device calibrates successively, within a respective calibration period, respective of the converter cells to values corresponding to the reference value and adjusts respective calibration periods for a calibration cycle, within which the converter cells are to be calibrated. At least two different of the respective calibration periods differ within at least two calibration cycles.

20 Claims, 6 Drawing Sheets

METHOD FOR CALIBRATING A DIGITAL/ANALOG CONVERTER AND DIGITAL/ANALOG CONVERTER

BACKGROUND OF THE INVENTION

The invention relates to a method for calibrating a digital/analog converter and to a digital/analog converter.

With respect to the general background of D/A converters, reference is generally made to U.S. Pat. Nos. 6,346,901 B1, 4,712,091 and 5,293,166. With respect to the general background of D/A converters with online self-calibration, reference is made to the publication by D. W. J. Groeneveld, H. J. Schouwenaars, H. A. H. Termeer, C. A. A. Bastiaansen, "A Self-Calibration Technique for Monolithic High-Resolution D/A Converters", IEEE Journal of Solid-State Circuits, volume 24, December 1989.

A digital/analog converter, also called D/A converter for short in the text which follows, is designed for converting a digital input signal into an analog output signal. Although it is basically applicable to any digital/analog converter, the present invention and the problems on which it is based will be explained in the text which follows with reference to a monolithic integrated D/A converter designed for high speed applications, with a facility for online self-calibration. By online calibration is meant that the calibration can be performed during the operation of the D/A converter, that is to say virtually in the background without a current D/A conversion having to be interrupted.

A monolithic integrated D/A converter typically has a multiplicity of converter cells arranged in a converter matrix or a so-called converter array. The individual converter cells are ideally identical in their configuration. A problem inherent in almost all monolithic integrated D/A converters consists in that typically mismatches exist between the individual converter cells which become noticeable as distortions in the spectrum of the analog output signal. The mismatches become evermore predominant with increasing integration, that is to say with increasing reduction of the size of the patterns located on the integrated circuit and can only be reduced at the cost of lesser integration and thus a larger chip area. Apart from higher costs for the D/A converter, it would also lead to a lower speed of the conversion and thus to a lower performance of the D/A converter.

To implement very high-quality communication systems with digital signal processing such as are used, for example, in mobile radio and for broadband applications, D/A converters with a medium or high sampling rate and the best possible analog characteristics are used. The quality and accuracy of such high-speed D/A converters depend on a multiplicity of different factors, of which the so-called spurious free dynamic range (SFDR) of the D/A converter represents a very decisive characteristic.

FIG. 1 shows a typical output spectrum AS which exhibits distortions in the output spectrum caused by mismatches of the D/A converter cells. In FIG. 1, the wavy line A designates the quantization noise. Apart from the frequency Fin of the input signal, there are also harmonics 2Fin, 3Fin at multiples of the frequency Fin. These harmonics 2Fin, 3Fin limit the interference-free dynamic range SFDR of the D/A converter which leads to a lesser effective resolution overall. As can be seen from FIG. 1, the interference-free dynamic range SFDR designates the difference between the maximum amplitude of the frequency Fin of the input signal and the amplitude of harmonic frequency component 2Fin which has the greatest amplitude among the harmonics 2Fin, 3Fin.

FIG. 2 will now be used to describe a calibration method, known, for example, from the IEEE publication described initially, which can be used for enlarging the interference-free dynamic range SFDR. The example in FIG. 2 shows the calibration principle by means of a 6-bit D/A converter B which thus exhibits 63 converter cells C largely of the same structure. For the calibration, the D/A converter B also has a redundant converter cell D (shown shaded in FIG. 2, cell 64) and a reference cell, not shown. The reference cell is used for the self-calibration in order to successively calibrate all converter cells of the D/A converter B. By using the redundant converter cell D, the self-calibration can be performed online, that is to say also during the operation of the D/A converter B.

In the example in FIG. 2, a total of 64 calibration cycles K1-K64, of which only the first three K1-K3 and the last one K64 have been shown in FIG. 2, are provided for calibrating the converter cells C, D of the D/A converter B. Passing through all calibration cycles K1-K64 defines a so-called calibration loop E. Within the calibration loop E, all converter cells C, beginning with the first converter cell, are successively calibrated including the redundant converter cell D. The calibration method then typically jumps back to the first converter cell in order to recalibrate the converter cells in the next calibration loop E.

The calibration of a respective converter cell C, D requires a calibration period T1-T64. This calibration period T1-T64 is predetermined for each converter cell C, D within the calibration loop and is thus constant. The calibration periods T1-T64 allocated to all converter cells C, D are thus equal.

During the determination of the calibration period T1-T64, the following must be observed: on the one hand, the calibration period T1-T64 must not be too small since otherwise the value of a respective converter element C, D to be calibrated cannot be properly corrected. On the other hand, the calibration period T1-T64 must also be selected to be not too large since otherwise the storage element, in which the difference between the value of the converter cell to be calibrated and the value of the corresponding reference cell is stored, loses the stored difference value and thus the entire calibration process would become ineffective. For this reason, the calibration period T1-T64 must be selected to be within a certain range which takes into account the two above boundary conditions and is thus selected to be not too small and not too large.

In this manner, it is possible to reduce a distortion in the output spectrum, caused by a mismatch of the converter cells within the converter array. However, this procedure has the disadvantage that, as a result, additional interfering frequencies are generated (see FIG. 1). It is found that, although the amplitudes of the harmonic frequencies 2Fin, 3Fin are reduced by the calibration, additional interfering frequencies are also generated at the calibration frequency Fcal and multiples thereof 2Fcal, 3Fcal due to the calibration. These additional interfering frequencies Fcal, 2Fcal, 3Fcal prevent a further overall improvement in the interference-free dynamic range SFDR.

BRIEF SUMMARY OF THE INVENTION

The invention provides a calibration method for calibrating a digital/analog converter comprising a multiplicity of converter cells and at least one reference cell, in which the respective value of the converter cells is successively calibrated to the value of the reference cell, wherein, for calibrating a converter cell, in each case a calibration period is provided within which the calibration of these converter cells is performed, wherein at least two different calibration periods are provided for calibrating all converter cells.

The invention also provides a digital/analog converter comprising a converter array with a multiplicity of converter cells and a device for self-calibration of converter cells, with at least one reference cell, the value of which is provided as reference for the calibration of the converter cells, with a control device for controlling the calibration process which calibrates the converter cells successively to the value of the reference cell and which adjusts a calibration period of a respective calibration cycle, within which a respective converter cell can be calibrated, wherein at least two different calibration periods are provided.

The invention is based on the finding that the use of constant calibration periods which are uniform for all converter cells of the D/A converter is not necessarily required especially since the use of uniform calibration periods is associated with an unwanted calibration frequency which counteracts any further improvement in the interference-free dynamic range overall.

The concept forming the basis of the present invention then consists in using variable, that is to say different calibration periods for the calibration process. This means that the individual converter cells of the D/A converter are no longer calibrated with a uniform, constant calibration period. Instead, these calibration periods are varied to a greater or lesser extent with the different converter cells. The effect of this procedure consists in that the distortion in the output spectrum of the analog output signal, which is associated with the calibration process, is significantly reduced which leads to an improvement in the interference-free dynamic range overall. The additional circuit expenditure required for this which, in particular, is associated with the generation of the more or less randomly selected calibration period, for example by using a random number generator, and the associated increase in the chip area, is negligible in view of the improved characteristics, for example with regard to the SFDR, especially when a modern so-called sub-micron CMOS technology is used in this implementation.

The respective calibration periods may be variably adjustable, for example via a control device separately provided for this purpose.

The different and/or variably adjustable calibration periods may be preferably randomly determined by means of a random-number generator within a predeterminable range of times.

For the calibration process, a calibration loop may be provided within which all converter cells are calibrated. This calibration loop may preferably be passed through several times iteratively.

Calibration cycles of different calibration periods may be provided for calibrating the converter cells, the at least two different calibration periods being assigned to a respective calibration cycle via a control device. In particular, the at least two different calibration periods are newly assigned to the individual converter cells for each calibration loop.

In a restricted version of the inventive D/A converter, a fixed allocation of the at least two different calibration periods to the individual converter cells is performed in such a manner that, although calibration cycles of different calibration period are used, the respective calibration period is predetermined within a respective calibration loop, with reference to a respective converter cell. In this case, therefore, there is a fixed correlation between the calibration periods of different lengths and individual converter cells.

In a further restricted version of the inventive D/A converter, for the converter cells to be calibrated, a number of calibration periods corresponding to the number of converter cells is predetermined which periods are in each case newly distributed with each calibration cycle to the converter cells to be calibrated. Thus, all calibration periods within a calibration loop preferably differ from one another.

A respective calibration period, which is newly determined for each new calibration cycle by a random number generator, may be successively allocated to the respective converter cell to be calibrated for each new calibration cycle. This additionally improves the interference-free dynamic range SFDR.

In another restricted version of the inventive digital/analog converter, its control device has a random number generator which is designed for determining for each calibration cycle a random value which is used for determining the calibration period. In the random number generator, a so-called pseudo random variable is preferably used for determining the calibration period. This is preferably used for each cell of the D/A converter to be calibrated. For this purpose, a so-called pseudo random generator can preferably be used which newly determines the calibration periods allocated to the respective converter cells more or less randomly for each calibration loop. The newly determined calibration period varies within a previously predetermined range of times.

For determining the random value for the calibration period, the random number generator may have a first device and a second device, wherein a fixed component of the random value can be determined for each calibration cycle via the first device and a variable component of the random value can be determined for each calibration cycle via the second device.

The random number generator may have a combining device, particularly a digital adder, in which the first and the second component are combined for obtaining the random value, and the random number generator has an output at which a signal is present which contains information about the random value.

A control input connected to the first device may be provided via which the fixed component of the random value can be adjusted.

A counter connected to an output of the device for self-calibration, particularly an up-counter or down-counter may preferably be provided which derives the respective calibration period from the digital signal obtained in the random number generator.

The device for self-calibration may have a shift register, particularly a linear shift register with feedback path.

DETAILED DESCRIPTION OF THE INVENTION

Figure 1:
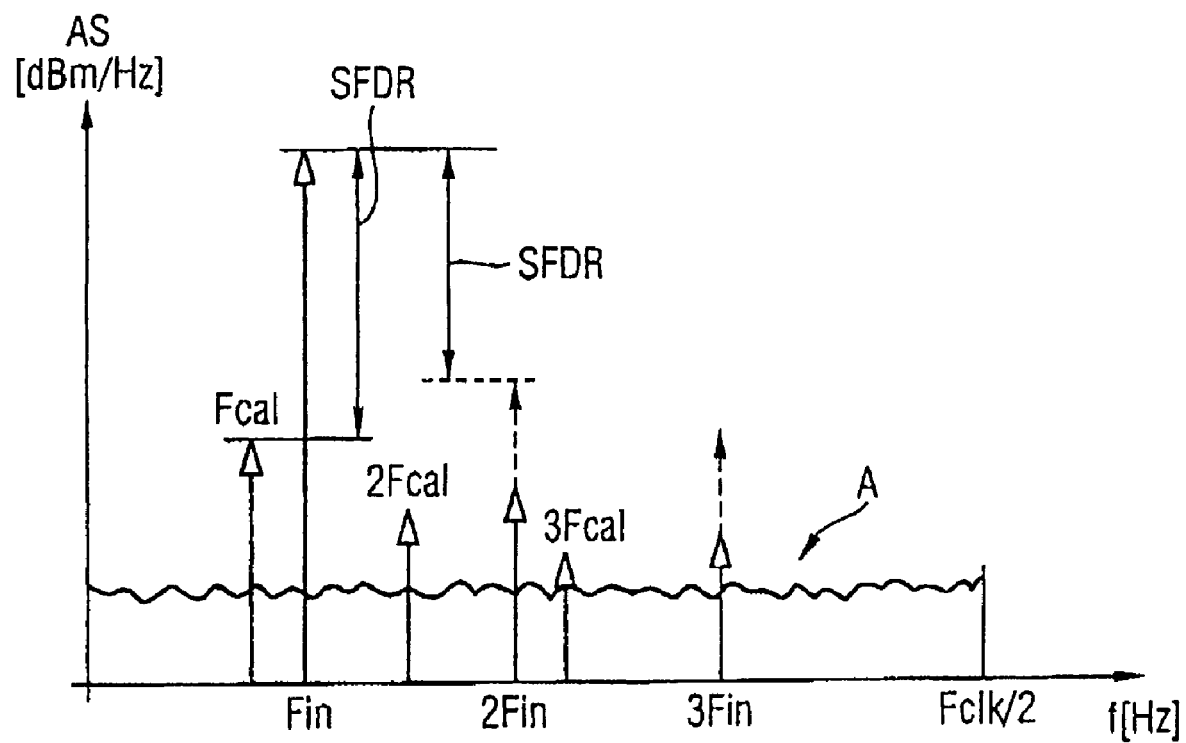
FIG. 1, as discussed above; is an output spectrum of a D/A converter with mismatch of D/A converter cells for explaining the interference-free dynamic range (SFDR).
Figure 2:
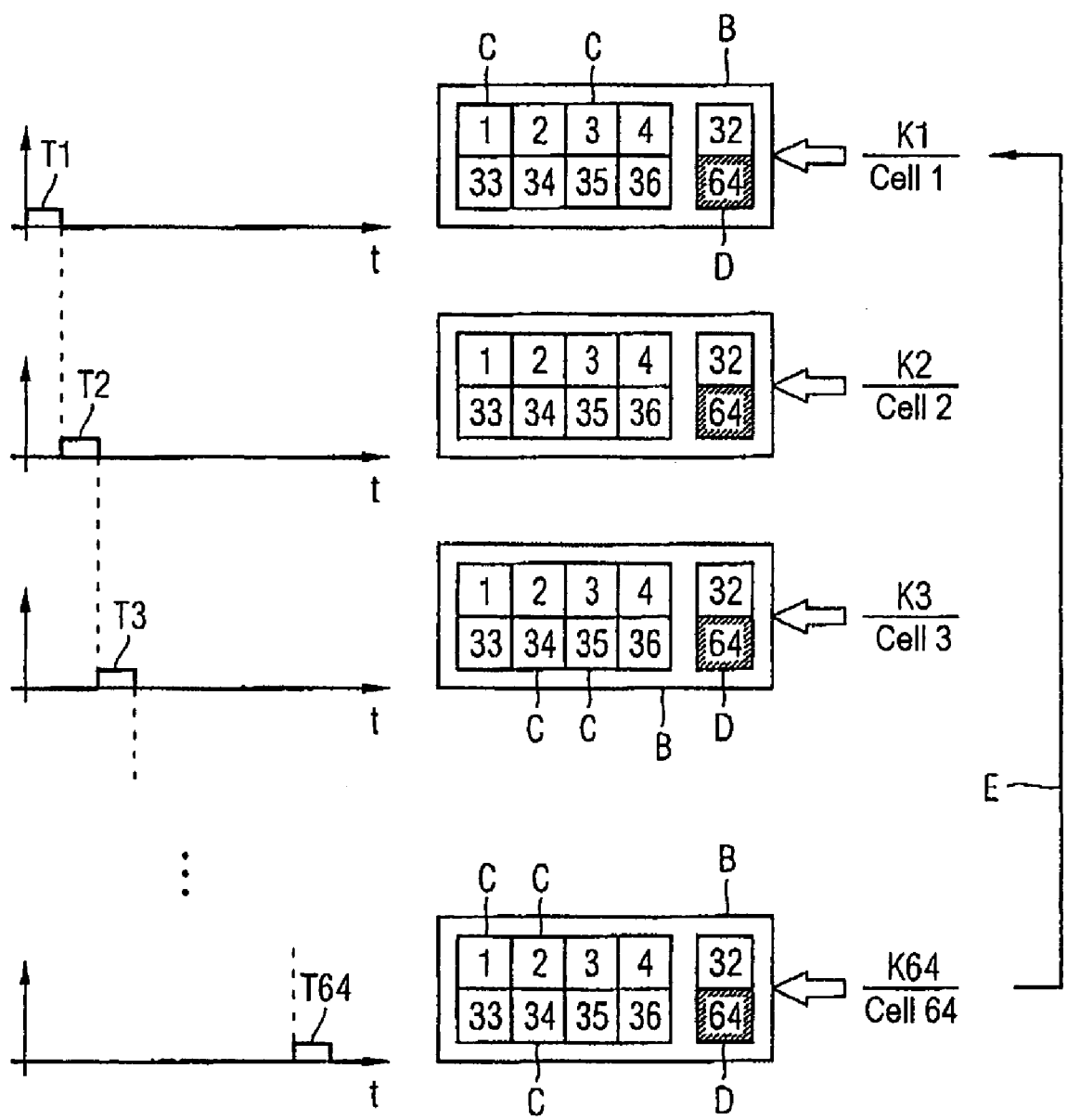
FIG. 2, as discussed above; is a block diagram for explaining a known calibration method for a 6-bit D/A converter.

In the figures of the drawing, identical or functionally identical elements, signals and features have in each case been provided with the same reference symbols unless differently specified.

Figure 3:
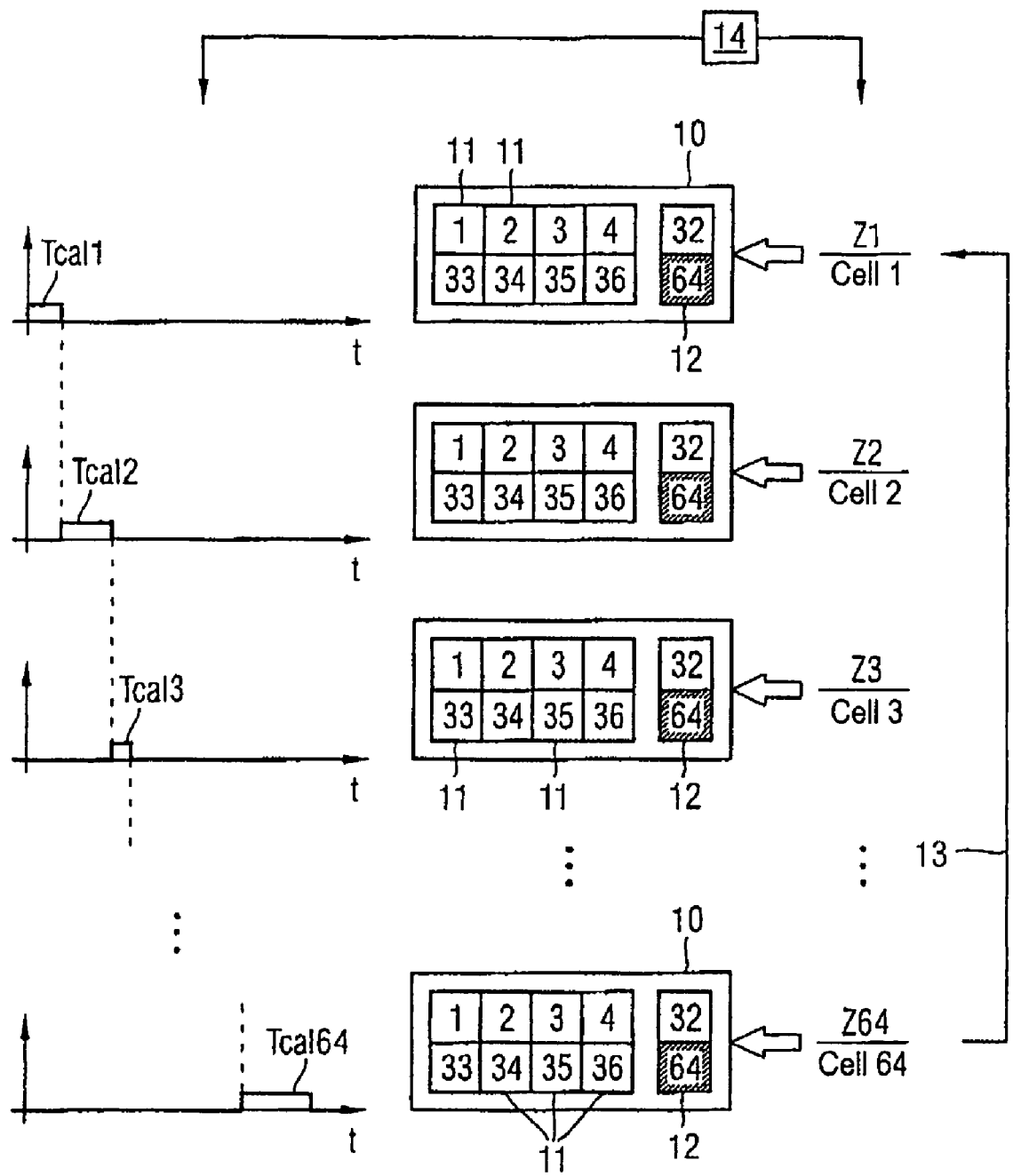
FIG. 3 is a block diagram for explaining the calibration method according to the invention for a 6-bit D/A converter.

FIG. 3 shows a block diagram for explaining the calibration method according to the invention for a 6-bit D/A converter.

In the basic block diagram of FIG. 3, the D/A converter is designated by the reference symbol 10. To convert a digital 6-bit wide input signal, present, for example, in thermometer code, a total of 63 converter cells 11 (cells 1 to 63) are required. Furthermore, it shall be assumed that the calibration of the converter cells 11 of the D/A converter 10 occurs online in the background, i.e. during the operation of the D/A converter 10. Since the calibration of the individual converter cells 11 can take place during the operation of the D/A converter 10, it is required to provide at least one additional converter cell 12 (cell 64, shown shaded in FIG. 3). This converter cell 12 will be called redundant converter cell 12 in the text which follows. The redundant converter cell 12 handles the task of the converter cell 11 currently to be calibrated during the calibration process. The D/A converter 10 also has a control device 14 for controlling the calibration process. Furthermore, a reference cell, not shown in FIG. 3, is required for the calibration.

To calibrate all converter cells 11 including the redundant converter cell 12, a total 64 calibration cycles Z1-Z64 are required, only the first three Z1-Z3 and the last calibration cycle Z64 of which have been shown in FIG. 3. During the calibration, all converter cells 11, 12 are calibrated successively, for example beginning with the first converter cell 11 and ending with the converter cell 64.

During the calibration, one converter cell 11, 12 is in each case successively decoupled. In calibration mode, the converter cell 11, 12 in each case to be calibrated no longer contributes to the generation of the analog output signal. The operation of the converter cell 11 to be calibrated and in each case decoupled is handled by the redundant converter cell 12. In the last calibration cycle Z64, finally, the redundant converter cell 12 is also calibrated. The calibration and in particular, the sequence of the individual calibration cycles K1-K64 is controlled by the control device 14.

The respective converter cell to be calibrated, or its value, respectively, is compared with the value of the reference cell in the calibration mode. The difference between the values of the converter cell 11, 12 to be calibrated and the reference cell represents the error of the converter cell 11, 12 to be calibrated which is stored in a memory specially provided for this purpose. This stored value is used for correcting the value of the converter cell to be calibrated for driving a controllable current source, for example one or more transistors, in accordance with the stored value. The current source is used for applying a calibration current corresponding to the stored value to the converter cell to be calibrated and thus to be calibrated to the value of the reference cell.

However, the respective value of a D/A converter cell within a D/A cell array is typically not statically stable over a prolonged period of time but deviates from the ideal, for example corrected, value with increasing time. The cause of this are parasitic effects which can be caused, for example, by deviations in the temperature, fluctuations in the supply voltage and the like. For these reasons, it is advantageous to provide a calibration method in which all D/A converter cells of the D/A cell array are successively calibrated and in which the calibration is begun again with the first D/A converter cell of the D/A cell array after the last D/A converter cell has been calibrated.

According to the invention, a calibration period Tcal1-Tcal64, which can be variable with respect to one another, is then allocated to a respective calibration cycle Z1-Z64. In the example in FIG. 3, only the calibration cycle Z64 for example has the greatest calibration period Tcal64 whereas the third calibration cycle Z3 has the shortest calibration period Tcal3. Naturally, the respective calibration periods Tcal1-Tcal64, as already mentioned initially, must not be too short so that sufficient time is still available for the actual calibration. On the other hand, it must not be too great, either, since the storage elements in which the values of the converter cells 11, 12 to be calibrated in each case are stored do not lose their value again before the calibration is concluded. The calibration period Tcal1-Tcal64 is also adjusted separately by the control device 14.

After the end of the calibration of all converter cells 11, 12, i.e. after the last calibration cycle Z64, the calibration can preferably be begun again with the first calibration cycle Z1 of the next calibration loop 13. As an alternative, it would also be conceivable that the calibration is interrupted here and begins again from the start, for example at a later time, e.g. after a predetermined time or after a predetermined event.

The sequence of calibration cycles Z1-Z64 shown in FIG. 3 is only exemplary and can also be arbitrarily varied which could also be of advantage in some applications.

The calibration method according to the invention can provide that the calibration periods Tcal1-Tcal64, which are associated with a respective specific converter cell 11, 12 and are determined within a calibration loop 13 remain the same for all calibration loops 13. As an alternative, it would also be conceivable that the calibration periods Tcal1-Tcal64 in each case allocated to a converter cell are changed again with each calibration loop 13.

It would be conceivable in this case, on the one hand, that the calibration periods Tcal1-Tcal64 already specified in the respective preceding calibration loop are only allocated to in each case different converter cells 11, 12 by redistribution. As an alternative, it would also be conceivable that the calibration period Tcal1-Tcal64 is randomly selected within the in each case predetermined range for the calibration period Tcal1-Tcal64. This can lead to short calibration periods occurring during a first calibration loop 13 and high calibration periods occurring during another calibration loop 13. Overall, this type of assignment of a variable calibration period Tcal1-Tcal64 leads to the corresponding calibration period Tcal1-Tcal64 becoming more or less uniformly distributed when a multiplicity of calibration loops 13 is used. As a result, the effect is that the distortions resulting from the calibration cycle are reduced to a minimum.

Figure 4:
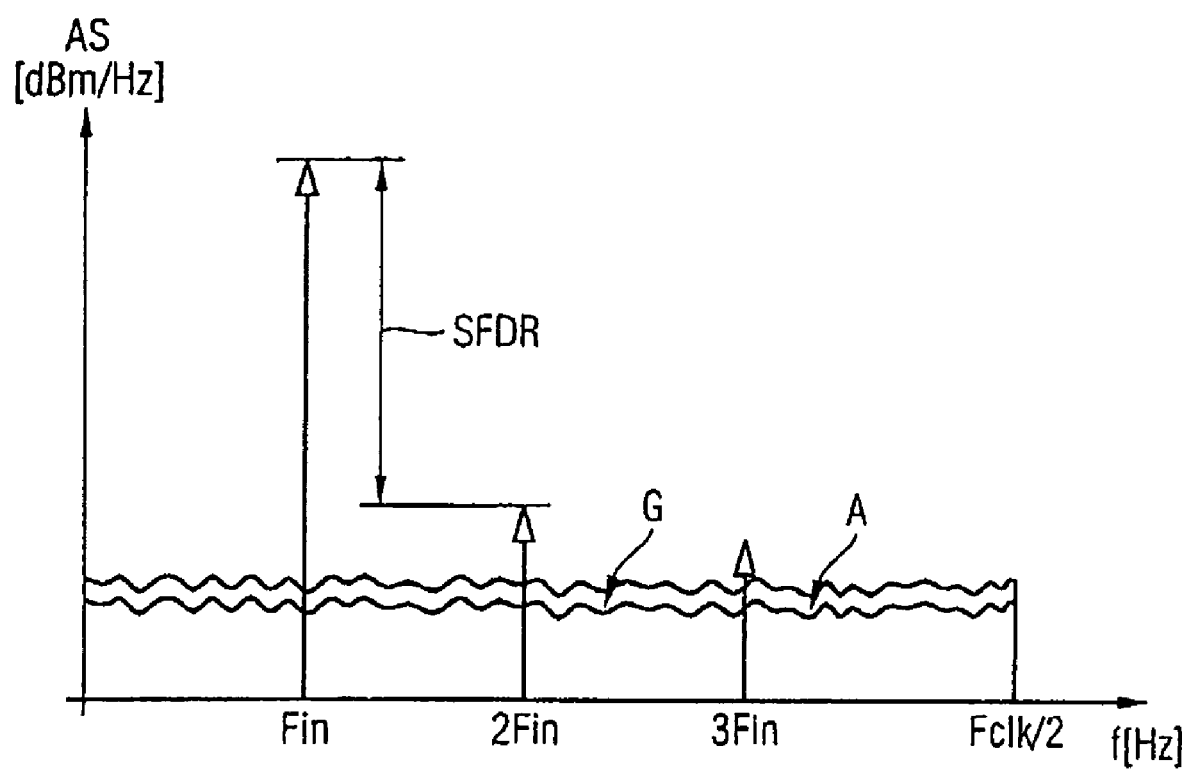
FIG. 4 is the output spectrum of a D/A converter calibrated by means of an embodiment of the inventive calibration method.

FIG. 4 shows corresponding output spectrum AS of a D/A converter calibrated by means of the calibration method according to the invention, described above. It is found, that in comparison with the output spectrum AS in FIG. 1, the interference-free dynamic range SFDR is further increased due to the method according to the invention. The wavy lines show the quantization noise A and the noise G generated by the correction.

Figure 5:
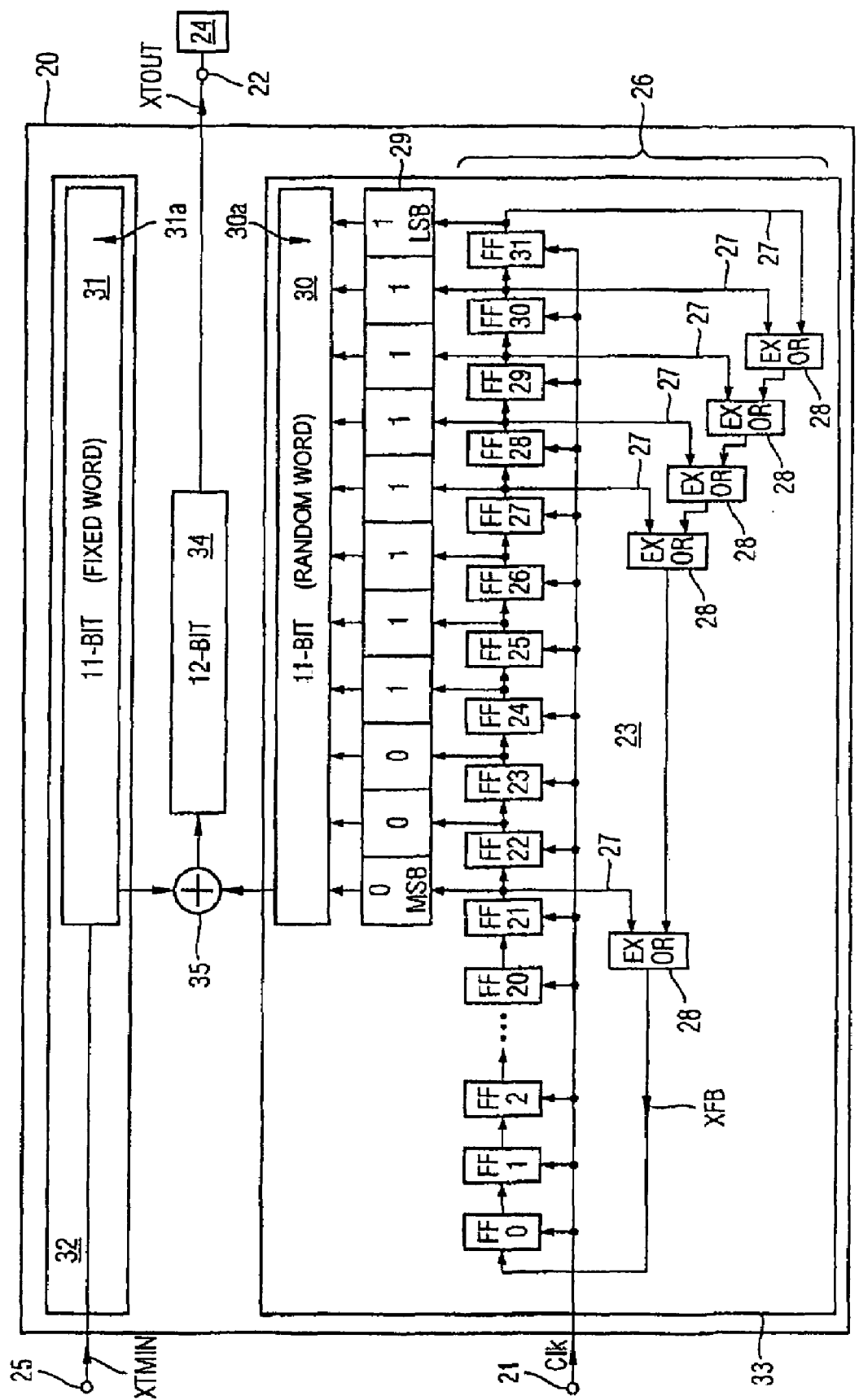
FIG. 5 is, by means of a block diagram; the structure of a pseudo random generator according to the invention for generating variable calibration periods.

FIG. 5 shows the structure of a pseudo random generator according to the invention for generating the variable calibration periods by means of a block diagram.

In FIG. 5, the pseudo random generator for generating random calibration periods Tcal1-Tcal64 is designated by reference symbol 20. The random number generator 20 has a first part 32 via which a fixed value is predetermined, and a second part 33 via which a random, and thus variable value of the random value to be determined by the random number generator 20 is adjusted.

The random number generator 20 has a clock input 21 for coupling in a clock signal CLK. Furthermore, an output 22 is provided from which a signal XTOUT can be picked up. The signal XTOUT contains information about the current defined calibration period TOUT by the random number generator 20. This current calibration period TOUT can be used for one or more of the calibration cycles Z1-Z64, for example as calibration period Tcal1-Tcal64. The random number generator 20 also has a control input 25 via which a control signal XTMIN can be coupled in which contains information about the minimum calibration period TMIN.

Random number generator 20 has in its second part a linear shift register 26 with feedback network 23 which is also called a linear feedback shift register (LFSR). In the present exemplary embodiment 32, the shift register 26 contains individual flip-flops FF0-FF31 which are arranged in series with one another beginning with flip-flop FF0 and ending with flip-flop FF31. The clock inputs of all flip-flops FF0-FF31 are connected to the clock input 21 and are thus triggered by the clock of the clock signal CLK. The data input of the first flip-flop FF0 is connected to the output of the feedback network 23. All flip-flops FF0-FF32 following flip-flop FF0 are in each case connected at the inputs to the respective data output of the preceding flip-flop. Shift register 26 also has taps 27 after flip-flops FF21, FF27-FF31. Via these taps 27, the respective output signals of the corresponding flip-flops FF21, FF27-FF31 are fed back. The taps 27 of the last two flip-flops FF30, FF31 are combined with one another in an XOR gate 28. The resultant feedback signal is combined with the signal from the tap 27 of flip-flop FF29 in a further XOR gate 28, etc. Using XOR gate 28 thus makes it possible to feed back the signals to taps 27. The resultant feedback signal XFB is coupled into the data input of the first flip-flop FF0.

The second part of the random number generator 20 has a digital mask 29 which defines a maximum random variation $\Delta t$. The output signals of flip-flops FF21-FF31 are supplied to the digital mask 29, the output signal of flip-flop 21 setting the MSB (most significant bit) of the digital mask 29 and the last flip-flop FF31 setting the LSB (least significant bit) of the digital mask 29. Thus, a respective logic level, that is to say a logical "0" or a logical "1", triggered by the clock signal CLK, is continuously shifted on by one flip-flop position via the shift register 26. In this manner, the value of the digital mask 29 is correspondingly changed, triggered via the clock signal CLK, as it were. Following this, an 11-bit wide signal defining the current random calibration period TRND is set by means of the value in the digital mask 29 in the device 30. In the device 30, a more or less random 11-bit wide data word 30a is thus present which contains information about the variation of the calibration period.

The first part 32 of the random number generator 20 has a device 31 connected to the control input 25. In the device 31, a predetermined 11-bit wide data word 31a is stored which can be adjusted via the control signal XTMIN and which contains information about the minimum calibration period TMIN.

All information items in devices 29, 30, 31 are present in digital form (having a bit width 11).

The contents of the devices 30, 31, i.e. the random and the predetermined 11-bit data word, are combined with one another in a combining device 35. The combining device 35 is preferably constructed as a simple digital adder 35 in which the two data words are thus added. At the output 22, the output signal XTOUT resulting from the addition is thus present.

In the present exemplary embodiment, a 12-bit wide signal is used as output signal XTOUT for determining the calibration period, as a result of which the resolution of the calibration period thus defined can be precisely defined as 1:2048. For a higher resolution, the random number generator 20 and, in particular, the devices 30, 31, would have to be expanded correspondingly.

For a lesser resolution, a lesser bit width can also be provided here.

The output 22 is followed by a counter 24, for example an up- or down-counter which generates the respective calibration period which is assigned to a calibration cycle from the signal XTOUT.

In FIG. 5, a more or less random calibration period, which is comprised of a first predetermined fixed component (circuit block 31) and a second variable, more or less random component (circuit block 30), is set by the pseudo random generator. In FIG. 5, the two components are of equal size and thus equally distributed. Naturally, a different distribution would also be conceivable. It would also be conceivable if the fixed component is omitted although this is associated with a very great variation of the calibration period. A more deterministic approach for defining the variable component would also be conceivable. It would also be conceivable if the value for the variable component is purely randomly determined.

Figure 6:
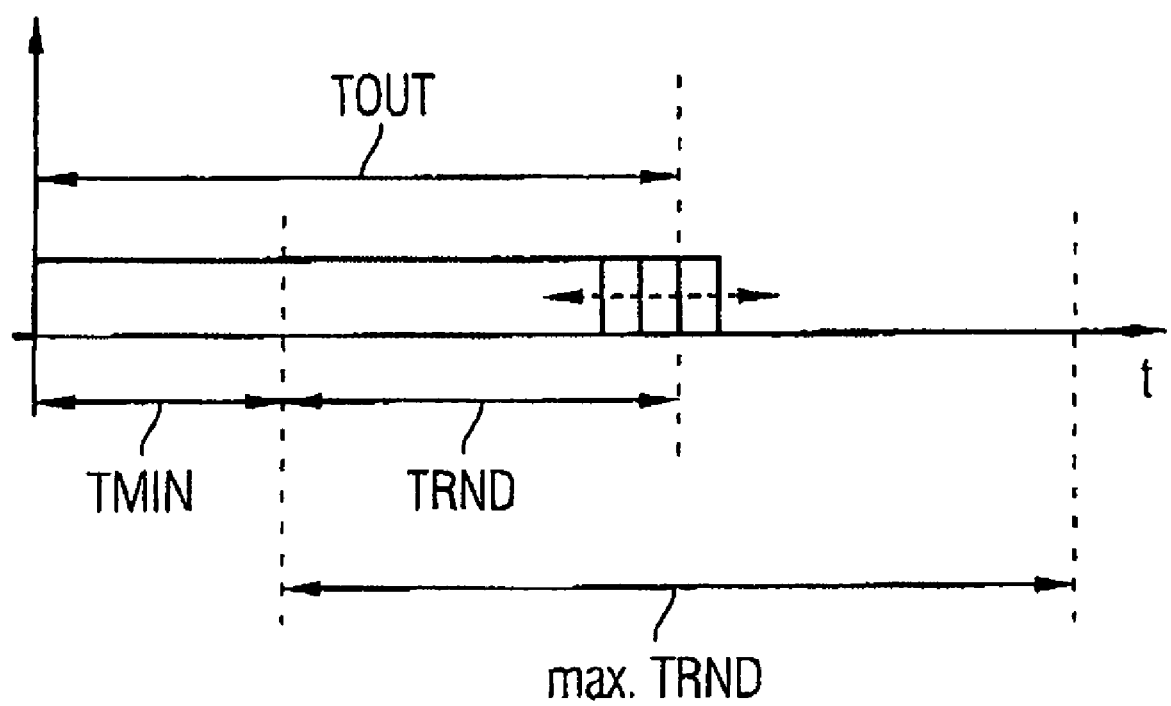
FIG. 6 is a diagrammatic representation for explaining the generation of variable calibration periods by means of the random number generator of FIG. 5.

FIG. 6 shows a diagrammatic representation for explaining the generation of the variable calibration periods by means of the random number generator of FIG. 5. TOUT designates the current calibration period which has been determined by the counter 24 from the signal XTOUT. TMIN designates the minimum calibration period, which is adjustable via the control input 25, which is thus predetermined by the device 31 and the first part 32 of the random number generator 20. This period TMIN is adjustable via the control signal XTMIN. "max.TRND" designates the maximum possible variable part of the calibration period which is essentially predeterminable by the circuit architecture of the random number generator 20. TRND designates the variable part of the calibration period currently calculated by the random number generator 20. Adding TMIN and TRND then results in the current calibration period TOUT.

Although the present invention has been described above by means of a preferred exemplary embodiment, it is not restricted to this but can be modified in many manners and ways.

The architecture of the shift register has been selected for obtaining the least possible correlation for calculating two successive random calibration periods. Naturally, a shift register having a lesser number of flip-flops and a correspondingly lesser number of taps and XOR gates would also be conceivable, but this would have the overall effect of increasing the correlation and thus the dependence of two successive calculations of the calibration period. By expanding the shift register, for example by providing more than 32 flip-flops and/or by providing a more extensively meshed feedback path, this correlation could be reduced. The exemplary embodiment shown by means of FIG. 5 represents a compromise between the least possible correlation of two successive calculations and a relatively low circuit expenditure.

Since the influence of the calibration period calculated in the preceding clock cycles on the currently calculated calibration period is negligibly low when the random number generator from FIG. 5 is used, but it still exists, the random number generator is also designated as pseudo random generator in the present patent application.

Instead of using a random number generator according to FIG. 5 for generating the different calibration periods, any other random number generators could also be provided additionally or as an alternative, the functionality of which is formed, for example, by a program-controlled device (e.g. as microcontroller or as hard wired logic circuit).

Although modifications and changes may be suggested by those skilled in the art, it is the intention of the inventors to embody within the patent warranted heron all changes and modifications as reasonably and properly come within the scope of their contribution to the art.

What is claimed is:

1. A method for calibrating a digital/analog converter comprising a plurality of uniform converter cells and at least one reference cell, said method comprising the step of:
   successively calibrating respective values of said uniform converter cells to said reference value of said reference cell, wherein said uniform converter cells are calibrated within a respective variably adjustable calibration period and wherein at least two of said respective variably adjustable calibration periods differ in their respective length of time, wherein said variably adjustable calibration periods are independent from systems parameters of the digital/analog converter.

2. The method of claim 1, wherein said calibration periods are variably adjustable.

3. The method of claim 1, wherein said calibration periods are randomly determined by means of a random number generator within a predeterminable range of times.

4. The method of claim 1, comprising providing a calibration loop wherein all of said uniform converter cells are calibrated; said calibration loop being passed through several times iteratively.

5. The method of claim 1, wherein, for calibrating said uniform converter cells, calibration cycles of different calibration periods are provided, wherein said at least two different calibration periods are assigned to a respective of said calibration cycles via a control device.

6. The method of claim 5, comprising providing a calibration loop within all of said uniform converter cells are calibrated; said calibration loop being passed through several times iteratively, wherein said at least two different calibration periods are newly assigned to an individual of said uniform converter cells for each calibration loop.

7. The method of claim 6, wherein a fixed allocation of said at least two different calibration periods to an individual of said uniform converter cells is performed in such a manner that, although said calibration cycles of different calibration period are used, the respective of said calibration periods is predetermined within a respective of said calibration loops with reference to a respective of said uniform converter cells.

8. The method of claim 5, comprising predetermining, for said uniform converter cells to be calibrated, a number of said calibration periods corresponding to the number of said uniform converter cells; wherein said calibration periods are newly distributed, with each said calibration cycle, to said uniform converter cells to be calibrated.

9. The method of claim 5, comprising determining newly a respective of said calibration periods for each new calibration cycle.

10. A digital/analog converter, comprising:
    a converter array comprised of a plurality of uniform converter cells; and
    a device for self-calibration of said uniform converter cells, comprising
    at least one reference cell with a reference value; and
    a control device for controlling a calibration process; said control device calibrating successively, within a respective variably adjustable calibration period, respective of said uniform converter cells to values corresponding to said reference value and said control device adjusting respective variably adjustable calibration periods for a calibration cycle, within which said uniform converter cells are to be calibrated; wherein at least two different of said respective calibration periods differ within at least two calibration cycles, wherein said variable adjustable calibration periods are independent from systems parameters of the digital/analog converter.

11. The converter of claim 10, wherein said control device comprises a random number generator for determining, for each calibration cycle, a random value which is used for determining said calibration period.

12. The converter of claim 11, wherein said, random number generator comprises a first device and a second device, wherein a fixed component of said random value can be determined for each calibration cycle via said first device and a variable component of said random value can be determined for each calibration cycle via said second device.

13. The converter of claim 12, wherein said random number generator comprises a combining device, in which said first and said second components are combined for obtaining said random value; said random number generator comprising an output at which a signal is present which comprises an information about said random value.

14. The converter of claim 13, wherein said combining device is a digital adder.

15. The converter of claim 12, comprising a control input connected to said first device; said fixed component of said random value being adjustable using said control input.

16. The converter of claim 12, comprising a counter connected to an output of said device for self-calibration; said counter deriving said respective calibration period from a signal obtained by said random number generator.

17. The converter of claim 16, wherein said counter is one of an up-counter or a down-counter.

18. The converter of claim 10, wherein said device for self-calibration comprises a shift register with feedback path.

19. The converter of claim 18, wherein said shift register is a linear shift register with feedback path.

20. A method for calibrating a digital/analog converter comprising a plurality of uniform converter cells and at least one reference cell; said method comprising the step of:
    successively calibrating respective values of said uniform converter cells to said reference value of said reference cell, wherein said uniform converter cells are calibrated within a respective variably adjustable calibration period and wherein the length of time of at least two of said respective variably adjustable calibration periods differ and are predetermined by means of a calibration device, wherein said variably adjustable calibration periods are independent from systems parameters of the digital/analog converter.

* * * * *